(12) United States Patent
Costello

(10) Patent No.: US 6,943,425 B2
(45) Date of Patent: Sep. 13, 2005

(54) WAVELENGTH EXTENSION FOR BACKTHINNED SILICON IMAGE ARRAYS

(75) Inventor: Kenneth A Costello, Union City, CA (US)

(73) Assignee: Intevac, Inc., Santa Clara, CA (US)

( * ) Notice: Subject to any disclaimer, the term of this patent is extended or adjusted under 35 U.S.C. 154(b) by 16 days.

(21) Appl. No.: 10/764,049

(22) Filed: Jan. 23, 2004

(65) Prior Publication Data

US 2005/0161703 A1    Jul. 28, 2005

(51) Int. Cl.[7] .............................................. H01L 31/00
(52) U.S. Cl. .......................... 257/447; 257/228; 438/75
(58) Field of Search ......................................... 257/447

(56) References Cited

U.S. PATENT DOCUMENTS

| | | |
|---|---|---|
| 3,971,932 A | 7/1976 | Sewell et al. |
| 4,687,922 A | 8/1987 | Lemonier et al. |
| 4,760,031 A | 7/1988 | Janesick |
| 4,822,748 A | 4/1989 | Janesick et al. |
| 4,891,507 A | 1/1990 | Lindmayer et al. |
| 5,233,183 A | 8/1993 | Field, Jr. |
| 5,266,425 A | 11/1993 | Field, Jr. |
| 5,541,012 A | 7/1996 | Ohwaki et al. |
| 5,742,115 A | 4/1998 | Gertsenshteyn |
| 5,965,875 A | 10/1999 | Merrill |
| 6,020,646 A | 2/2000 | Boyle et al. |
| 6,285,018 B1 | 9/2001 | Aebi et al. |
| 6,507,147 B1 | 1/2003 | Costello |
| 6,657,178 B2 | 12/2003 | Aebi |

*Primary Examiner*—Douglas A. Wille
(74) *Attorney, Agent, or Firm*—Stanley Z Cole

(57) ABSTRACT

There is described a back thinned sensor in which a material is added on the front surface to extend the wavelength of the sensor into wavelengths it normally does not reach. In the preferred embodiment, the back-thinned layer comprises silicon and is the base for a CMOS device or a CCD. The photocathode in a night vision device comprises in the preferred unit GaAs.

27 Claims, 6 Drawing Sheets

IR Extended Backthinned Silicon CCD

WAVELENGTH EXTENSION FOR BACKTHINNED SILICON IMAGE ARRAYS

This invention has to do with extending the wavelength response of back-thinned silicon image arrays.

BACKGROUND OF THE INVENTION

Back-thinned silicon arrays are used in various photographic systems. For example back-thinned silicon CCDs are used today in various camera systems as is described for example in U.S. Pat. Nos. 4,760,031, 4,822,748 and 4,687,922 and back-thinned silicon CMOS structures are being used with particular success in various night vision systems. One such application is the use of such an array in cameras that reproduce images using bombardment by electrons of pixel sensors. This system is described for example in U.S. Pat. Nos. 6,285,018, 6,657,178 and 6,507,147.

Cameras to create images based on electron bombardment represent, among other things, a new generation of high performance night vision video sensors. Their light-weight and compact size match the requirements for head mounted night vision systems. Such cameras have an effective spectral response that results from the sum of both the responses of their photocathode and the underlying pixel sensors. One such sensor designed for night vision applications would typically employ a GaAs photocathode and a silicon-based active pixel sensor to sense and read out the image data. As a consequence of this choice, such sensors have a spectral response that ranges from just short of 400 nm to ~1100 nm where silicon's response falls off. The long wavelength response of these type sensors may be extended through the use of a wavelength up-conversion material.

Certain established principles have been applied to the design of light sensing detectors that make use of up-conversion materials. In order to obtain the highest possible signal to noise ratio (SNR), the wavelength-shifting material is typically the first element in the optical chain that has significant absorption at the wavelength that is to be detected. In the case of photocathode-based devices, the material is best placed as an under-layer between the input window and the photocathode. This position insures that all the photons available within the up-conversion materials usable wavelength range are efficiently used. Furthermore, the tight coupling to the photocathode insures that photo-electrons based on the up-conversion-material's output are efficiently generated allowing subsequent photoelectron gain. The combination of efficient use and gain, results in the best possible detector SNR. The same principle applies to bare silicon focal plane arrays coated with up conversion materials. The silicon surface upon which the light is incident is coated with the up-conversion material. On a front-surface silicon focal plane device the front of the sensor is coated with up-conversion material resulting in an extended wavelength response detector with reasonable sensitivity. However, due to the overlying gate structures in CCDs and the overlying metal structures in CMOS focal plane arrays, additional performance can be obtained by backside thinning the sensor and taking light in the backside of the device. Backside thinning is a costly process. However, properly designed back-thinned silicon focal plane arrays can detect light effectively over 100% of their back surfaces, often a factor of ~2x greater sensitivity than their front side counterparts. Consequently, in cases where performance is paramount, backside thinned silicon focal plane arrays can be used in conjunction with up-conversion materials. In this case, the logical placement of the up-conversion material follows the incoming light to the backside of the device thereby avoiding the scattering and transmission losses associated with first traversing the focal plane array. This said, a different set of selection criteria apply to the sensors envisioned and described in this invention. Specifically, operational benefit can be obtained through incorporation of a low level of added long wavelength sensitivity to high performance night vision sensors in military and law-enforcement applications. The main goal of this additional response is not to add to the overall low light level performance of the device but rather to allow the detection and imaging of relative high levels of 1100–2000 nm light, generally considered near infrared light, within night-time imagery when such illumination is present. In these sensors, considerable expense has been expended to obtain the best possible low light level performance. Coating the back surface of the back-thinned silicon focal plane array with an up-conversion material results in scattering, reflection and transmission losses to the light required to form the night vision image. In the case of electron bombarded back-thinned silicon focal plane arrays, a layer of up-conversion material on the back surface would unacceptably block and scatter incoming electrons. Consequently, although there are additional losses at long wavelengths, this invention places the up-conversion material to the front surface of the back-thinned silicon focal plane array.

An alternate class of night vision focal-plane sensors incorporates gain within a specially modified CCD. E2V's CCD65 and Texas Instruments TC285SPD exemplify this class of sensors. These CCDs are well suited for night vision applications. Improved low light performance can be achieved on CCDs through backside thinning and antireflection coating. E2V's selection guide shows that CCDs can be obtained with a variety of options including backside thinning and phosphor coating in order to extend the wavelength response of the CCD into the UV or X-ray wavelength range. In each case though, the phosphor coating resides on the surface through which the incoming light enters. This is an obvious placement for a phosphor conversion layer; it maximizes conversion efficiency for the wavelengths served by the phosphor. In this invention a phosphor conversion layer is also used. However, the phosphor used with a backside thinned silicon, is positioned at the surface of the silicon opposite the side exposed to incoming light on a backside thinned CCD. Although less of the incoming light is transmitted to the phosphor layer when the layer is positioned under the thinned silicon, the first pass light directly detected by the CCD is not subject to the reflective, absorptive and scattering affects of the phosphor layer. This positioning is further facilitated by the optical transmission of silicon based CCDs within the 1100–2000 nm range. Whereas UV light is completely absorbed within the CCD, near IR light in the 1100–2000 nm range is only lightly absorbed. Consequently, the proposed placement of the layer results in undiminished performance in the back-thinned CCDs primary detection while retaining most of the potential performance of the up-converting phosphor. It is a further goal of this invention that the up-conversion material and associated layers be compatible with the high-temperature processing required to fabricate ultra-high vacuum (UHV) electron bombarded sensors.

SUMMARY OF THIS INVENTION

It is a goal of this invention to achieve extended wavelength results with no loss in low light level performance or image quality in a camera system based on a back-thinned silicon focal plane. The primary targeted application of these back-thinned silicon focal planes is their use as anodes within an electron bombarded night vision sensor. Consequently, the approach detailed in U.S. Pat. No. 4,891,507 is not used. In order to achieve the stated goals, the preferred embodiment places the up-conversion material on the surface opposite that of the incoming light, typically between a back-thinned sensor and it's support substrate. Although the 1100–2000 nm light is significantly attenuated by this point, the over-riding goal of not adversely impacting the low light level image performance of the sensor is maintained. The placement of the up-converter at the supported surface of the back-thinned sensor makes use of a "charged" up-conversion material very difficult; consequently, the preferred embodiment makes use of an anti-Stokes up-conversion material. Increased power draw and system-level complication are also avoided by using an anti-Stokes up-converter (See U.S. Pat. Nos. 5,541,012, 3,971,932). Up-converter layers with a variety of spectral response curves can be generated.

DETAILED DESCRIPTION OF THE INVENTION

Figure 1:
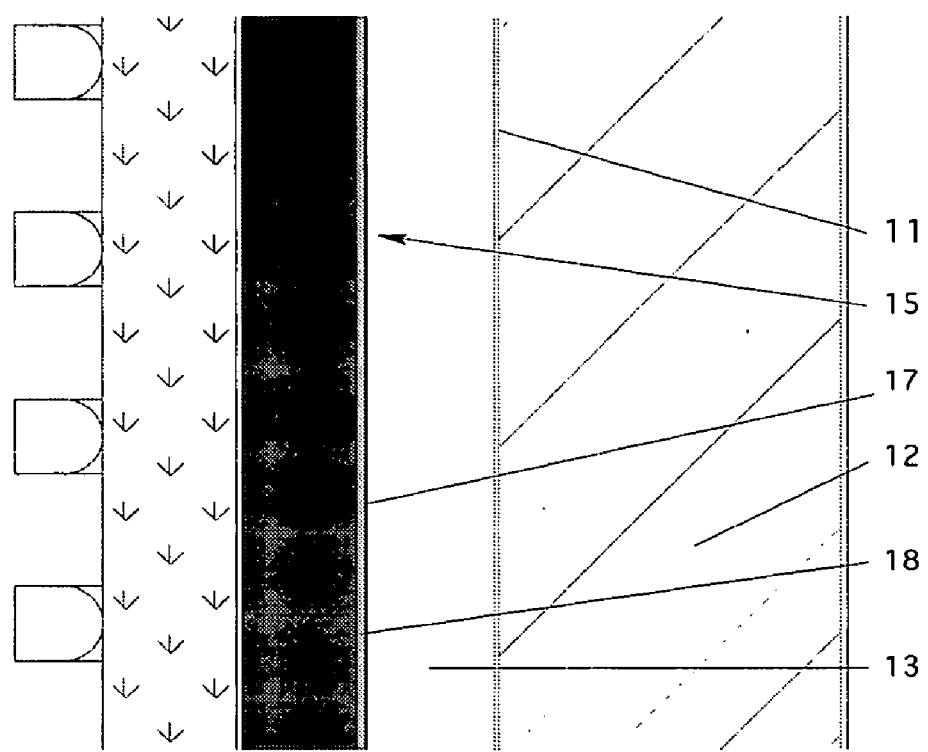
FIG. 1 is a schematic illustration of the preferred embodiment of the new sensor according to this invention.

Referring now to FIG. 1, there is illustrated a CMOS sensor in accordance with this invention in position in a structure in which the back-thinned CMOS is exposed to electron bombardment. In this Figure, 11 represents a photocathode which in the preferred embodiment is a GaAs layer positioned on sensor window 12 which may comprise a transparent glass layer. Sensor window 12 represents the outer wall of the device illustrated. A vacuum separation 13 is between photocathode 11 and back-thinned surface 17 of silicon material of the CMOS imager 15. The back-thinned surface 17 comprises one of the outer surfaces of the CMOS sensor 15. Positioned between or under the back-thinned silicon layer 17 of sensor 15 and the remainder of the supporting assembly of sensor 15 is an up-conversion material or layer 18.

Figure 2:
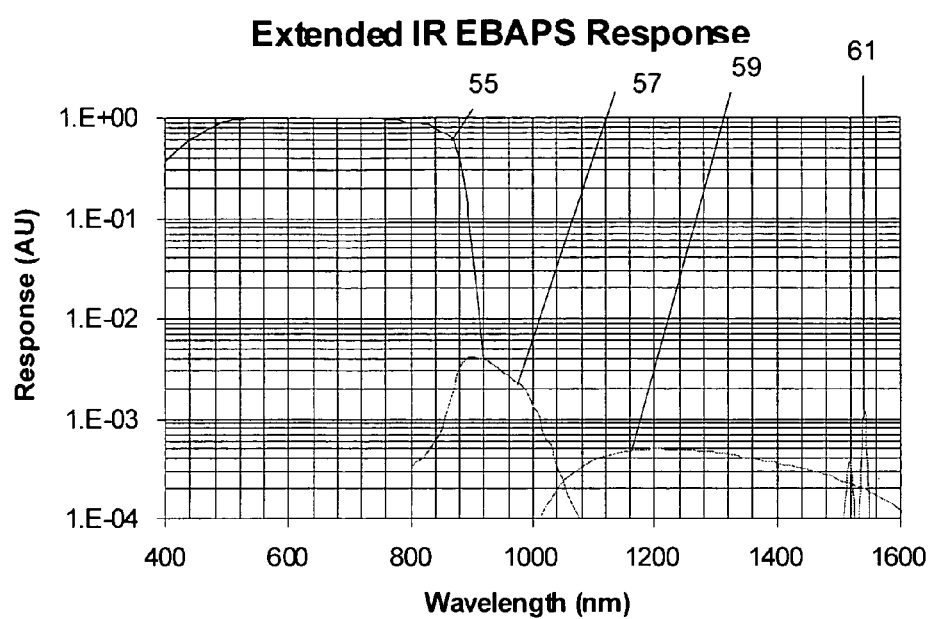
FIG. 2 is a graphic illustration of wavelength responses attributed to the various components of a sensor with the application of this invention.

One specific goal of the detector is to be able to allow the detection of aiming lights. Aiming lights that fall between 1100 and 2000 nm would normally be invisible to both silicon based cameras and $3^{rd}$ generation image intensifiers using GaAs as the photocathode. Ideally, an "eye-safe" wavelength of ~1.5 microns (~1500 nm) is desired for these devices so that the aiming spot can be seen at a long range with out the risk of eye damage. Although very low over-all 1100–2000 nm sensitivity results from both the position of the up-conversion layer and the choice of an anti-Stokes material, sufficient response remains to allow operationally meaningful performance. One commercially available up-converting material can be purchased from Phosphor Technology Ltd., UK. Phosphor Technologies PTIR545UF will up-convert light from ~1.5 microns wavelength to wavelengths that can be detected by a silicon image sensor. An idealized spectral response for the described sensor is shown in FIG. 2. The curve at the left identified as 55 shows the response of the photocathode of GaAs, the one in the middle 57 shows the response of the back-thinned silicon and the next curves 59 and 61 show the response of two different idealized up-conversion phosphors. Since the response of anti-Stokes phosphors tend to follow a power law response as opposed to a linear response, the relative response of the phosphor and the other components will vary as a function of illumination intensity. The response graphs should not be considered to be quantitative.

One advantage of positioning the up-conversion material as shown as opposed to placing the phosphor at the photocathode is that it can be used to achieve a false-color output based on the phosphors response without resorting to complicated alignment and processing techniques. (U.S. Pat. Nos. 4,374,325, 5,233,183, 5,266,425, 5,742,115). Previous false color night vision techniques either make use of filters that absorb and waste low light level photons or resort to the use of multiple image sensors. The technique of this invention uses a single sensor and does not waste primary night vision photons via absorption in filters. False color is obtained in one of two ways either the up-conversion material is patterned over individual pixels in a Bayer-like pattern or, the silicon sensor comprises stacked photodiodes CMOS to achieve pixel by pixel color information (See U.S. Pat. No. 5,965,875). In the stacked photodiode embodiment, photocathode generated electrons will be detected on the deepest photodiode; whereas, up-conversion material generated electrons will be weighted toward the shallow diodes. The output of the various stacked photodiodes can then be displayed as a false-color image thereby highlighting the long wavelength illuminated objects. Further color discrimination can be achieved through the use of multiple up-conversion layers that respond to different wavelengths of light and up-convert to different short wave bands. Similarly, color discrimination can be achieved via patterned deposition of various up-conversion materials to correspond to individual CMOS pixels in a Bayer-like pattern. Either multiple varieties of up converting phosphors could be used to generate the Bayer pattern or certain "colors" of the Bayer pattern can simply be left uncoated.

In the simplest embodiment, which does not employ a false color readout, Phosphor Technologies PTIR545UF up-conversion material is mixed with a low melting point frit (see U.S. Pat. No. 6,020,646) and applied to the front surface of the silicon focal plane array. This phosphor has been demonstrated to survive the frit firing process. The anode assembly is then finished as described in U.S. Pat. No. 6,020,646, no transparent cap or reflective layer is required. The other embodiments described herein are focused at improving one or more aspects of sensor performance.

Performance of the up-converting layer can be further improved by over-coating the layer with a layer of aluminum or other reflective material. Some up-converting materials may interact with reflective metal layers at elevated temperatures. Isolation between the up-converting layer and the reflective layer can be insured via the deposition of a transparent cap layer. The transparent cap layer can be formed of $SiO_xN_y$ within a PECVD reactor. PECVD deposition can yield smooth conformal coating that makes a good base for the subsequent reflective deposition. A suitable reflective layer can be generated via a thermal or sputtered aluminum deposition. A structure built up in the described manner has the additional benefit of being relatively robust physically. The structure can survive the stresses and high temperatures associated with subsequent frit bonding and subsequent UHV vacuum processing.

Figure 3:
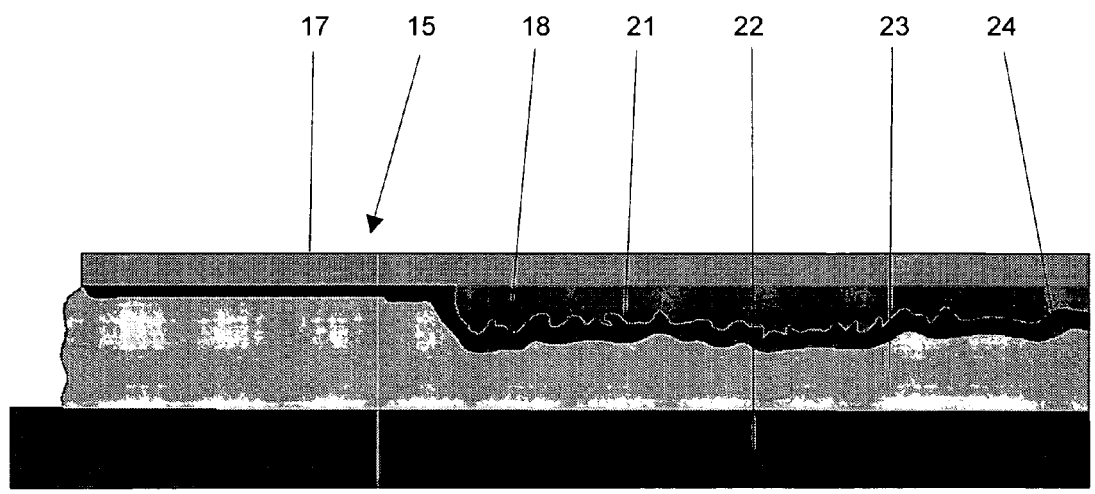
FIG. 3 is a close up view of the preferred embodiment of a sensor according to this invention.

A not-to-scale sketch of the improved structure is illustrated in FIG. 3. A further antireflection coating may be interposed between the silicon sensor and the up-converting material layer if required. Surface 17 represents the back-thinned surface of silicon sensor 15. Layer 18 represents the up-converting material, 21 the transparent cap layer, 24 the reflective layer, and 23 the frit layer. The underlying support structure for the sensor is identified as 22. In an actual structure typical thicknesses are listed below:

| Layer | Thickness |
| --- | --- |
| Back-thinned CMOS silicon sensor 15 | 4–50 microns, 10 typical |
| Up-converting material 18 | .1–10 microns, 3 typical |
| Transparent cap layer 21 | .1–5 microns, 1 typical |
| Reflective layer 24 | 100–10000 Angstroms, 1000 typical |
| Frit layer 23 | 5–200 microns, 50 microns typical |
| Support structure 22 | 50–2000 microns, 700 typical |

Build-up of a suitable sensor, frit, support structure assembly, not including the benefit of the current invention, is described by Boyle et al. in U.S. Pat. No. 6,020,646. Similarly, the up-converting layer could be used without the benefit of the supporting frit in a sensor similar to the one described by Lemonier in U.S. Pat. No. 4,687,922.

Figure 4:
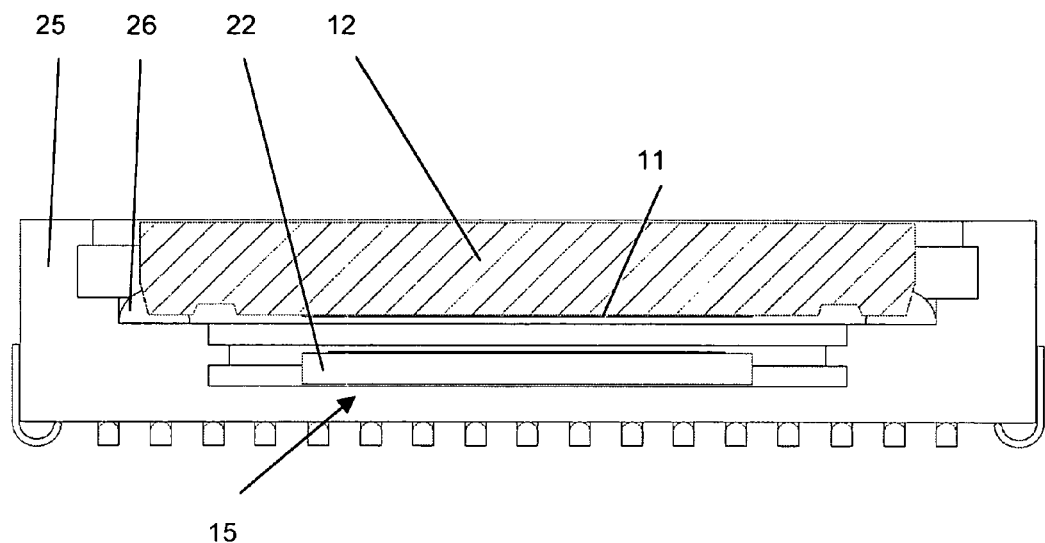
FIG. 4 is a schematic illustration of a sensor in position in a package in which a sensor is exposed to electron bombardment.

FIG. 4 illustrates a packaged CMOS sensor 15 to provide an electronic output conforming to an incoming image. Signals corresponding to the image are communicated via output connections to a video output system. This package is more fully described in my earlier patent U.S. Pat. No. 6,507,147. 12 represents the transparent window through which an image travels to photocathode 11. A soft metal crush seal 26, preferably indium, which surrounds the photocathode 11, connects the photocathode to high voltage as is described in the aforementioned patent that is incorporated herein by reference. 25 comprises the ceramic enclosure and 22 comprises the support substrate for the CMOS sensor 15, the silicon surface of which is positioned facing photocathode 11 across a vacuum area.

Figure 5:
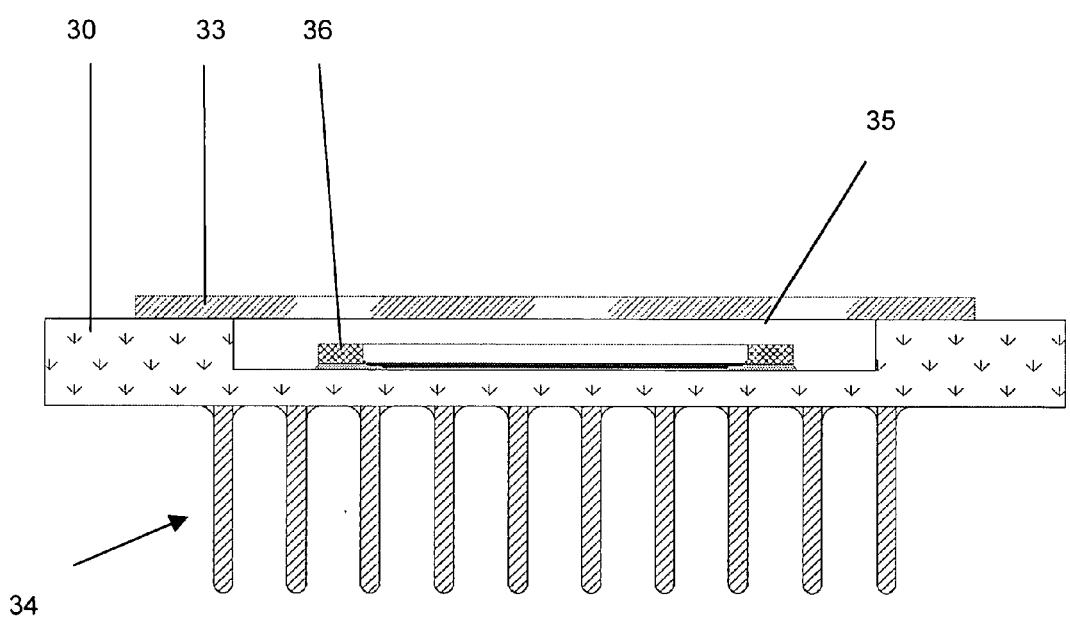
FIG. 5 is a schematic illustration of a back-thinned CCD incorporating this invention.

FIG. 5 illustrates the positioning of a back-thinned CCD having applicability as a night vision focal-plane sensor incorporating gain. This is the class of sensor comprising a specially modified CCD previously discussed under the heading "Summary of this Invention" as further modified in accordance with this disclosure as illustrated in connection with FIGS. 6 and 7. In FIG. 5, 30 represents a CCD package in accordance with this invention. 33 the package window of glass or other transparent material and 36 the back-thinned silicon CCD. Air or an inert gas may be positioned between the window 33 and the back-thinned CCD 36. The electronic image created at the CCD is then fed out through leads or external terminals 34 where the output may be directed to a video display terminal for viewing in a conventional manner.

Figure 6:
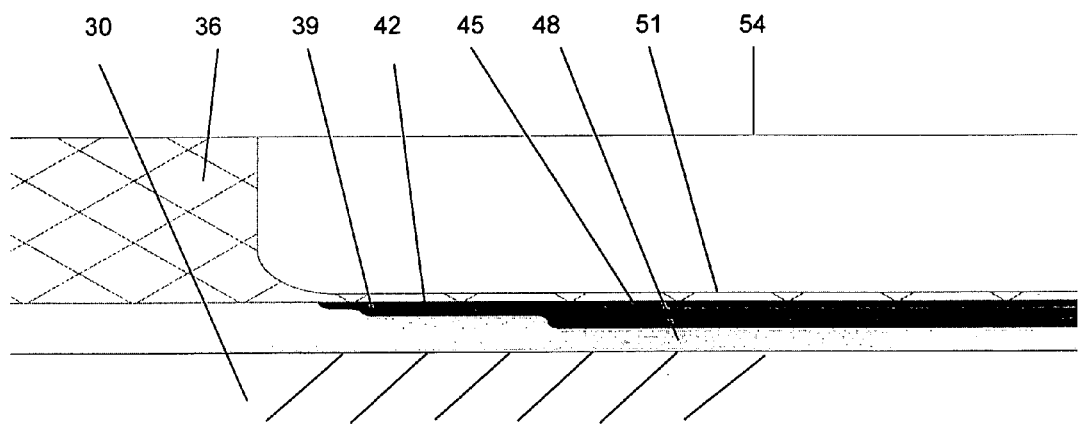
FIG. 6 is a schematic illustration of a package incorporating a back-thinned CCD in accordance with this invention.

Referring now to FIG. 6 there is illustrated in greater detail the back-thinned silicon CCD package 36 discussed in connection with the illustration in FIG. 5. In FIG. 6, 54 represents the unthinned edge of a CCD that has been thinned only over the active area of the CCD focal plane. Following back-thinning, 51 represents the back-thinned silicon surface or surface layer. Since this is not a vacuum device, there is no need for a frit layer and instead an epoxy layer 48 is used to hold the device together. 45 represents the layer of up-conversion material that is positioned between the silicon surface layer 51 of the CCD and a transparent cap 42. The transparent cap functions to provide insulation between the reflective layer and up-converting materials. 39 is a reflective layer which may comprise aluminum or some other reflective material which can improve performance of the up-conversion layer in the system. This layer is positioned between the transparent cap and the epoxy. The transparent cap layer, as in the case of the back-thinned CMOS, can be formed of $SiO_xN_y$ within a PECVD reactor. PECVD deposition yields smooth conformal coatings that act as a good base for the subsequent reflective deposition. A suitable reflective layer as in the case of the back-thinned CMOS unit can be generated via a thermal or sputtered aluminum deposition. 30 is a support substrate or may comprise the package for the CCD. As described, the CCD constructed in this fashion is in fact a structurally sound unit.

Figure 7:
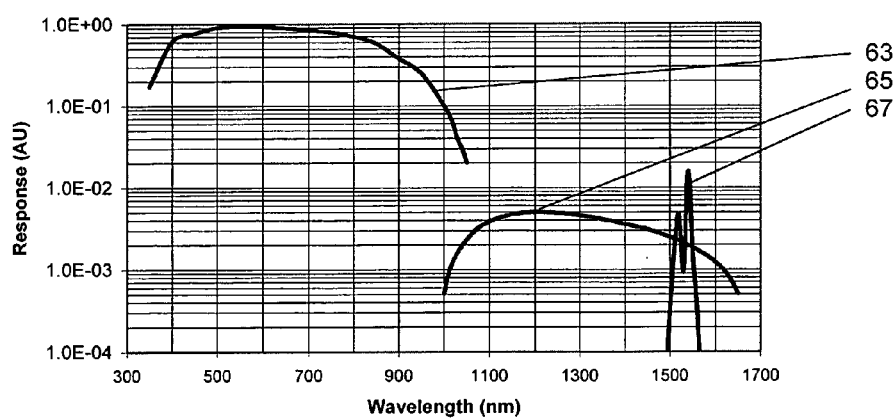
FIG. 7 is a graph of wavelength response for a CCD in accordance with this invention.

FIG. 7 illustrates the response of the back-thinned CCD according to this invention. 63 represents the response of the back-thinned silicon and 65 and 67 show the effects of incorporating up-conversion layers in the CCD package or structure. As has been previously described and depending on the selection and patterning of phosphors for this purpose one can also create false colors that will identify the wavelength of the particular displayed images.

Figure 8:
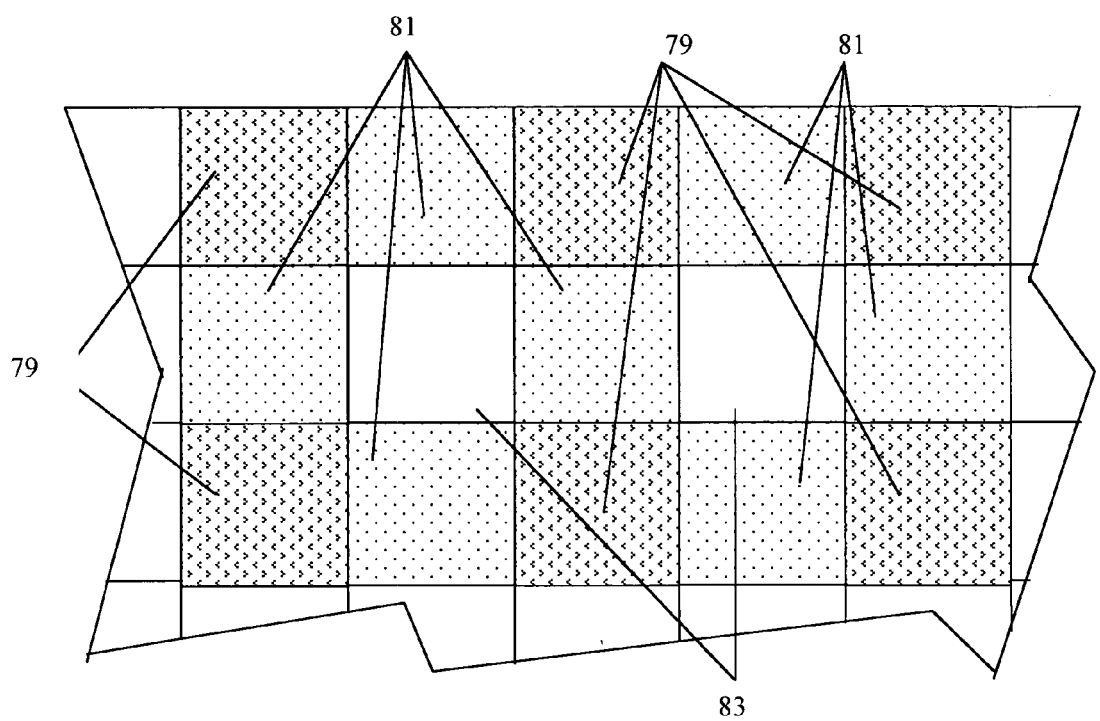
FIG. 8 is a sketch of a portion of a focal plane image array intended to produce false color output as will be explained hereinafter.

Referring now to FIG. 8, there is illustrated a sensor that produces false color output. The squares represent the pixel array. Each pixel is labeled with the color that the display electronics will assign to the signal output by the underlying pixel, 79 being red, 81 green and 83 blue. The textures applied to the pixels represent the up-conversion material coated over the front surface of the pixels. Pixels displayed as red, 79, are coated with one type of up-conversion material, pixels displayed as green, 81, are coated with a second type of up-conversion material and pixels displayed as blue, 83, are left uncoated. A sensor coated and displayed in this manner will result in a false color output showing three different colors. Many other color/up-conversion material patterns can be envisioned and supported via commercially available electronic components.

Figure 9:
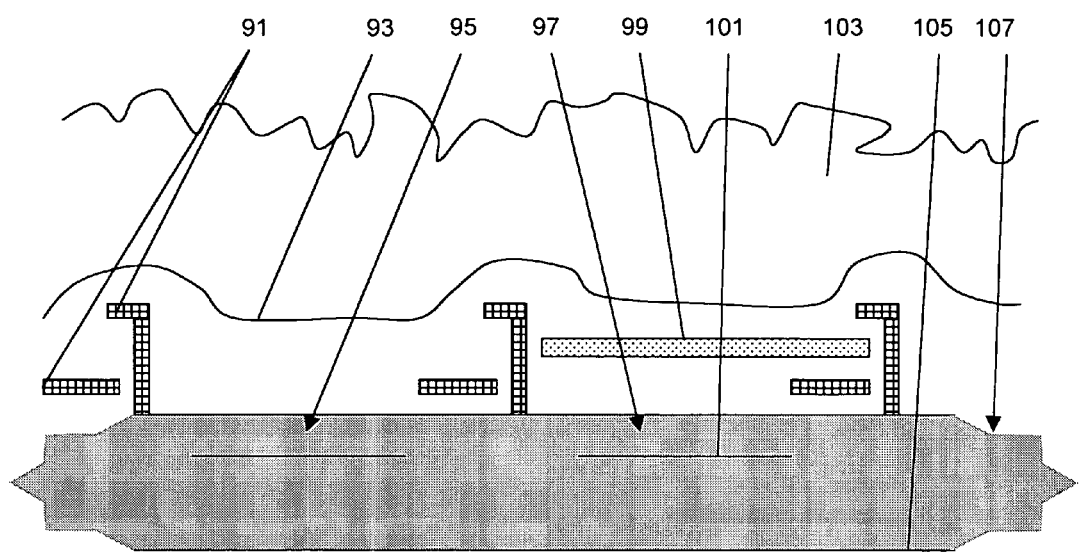
FIG. 9 is a schematic cross sectional view of a back-thinned focal plane sensor with an up-conversion layer on the front surface of the sensor incorporating a filter to obtain false colors.

In FIG. 9 The focal plane incorporates a "filter" on a predetermined pattern of pixels in order to obtain a false color signal. 91 represents interconnect metallization typical of CMOS focal plane arrays. 93 represents the original front surface of the focal plane array. 95 indicates the active area of an unfiltered pixel. 97 represents the active area of a filtered pixel. 99 is the filter that blocks optical communication between the up-conversion material and the backthinned silicon focal plane array. 101 indicates the position of the photo-junction that detects light in the filtered pixel. 103 indicates the up-conversion material layer. 105 indicates the back thinned surface of the silicon focal plane array. 107 represents the silicon material of the focal plane array. Additional layers can be used over the up-conversion material layer 103. As was previously shown, a transparent cap layer and a reflective layer may overlay the depicted layers.

An alternate embodiment of the false color sensor can be realized by depositing "filters" over a specific pattern of pixels before the up-conversion material is deposited. This embodiment is illustrated in FIG. 9. The filters are used to block light transmission between the up-conversion layer and the focal plane array. In the most basic embodiment, the "filter" could consist of a reflective aluminum layer, ~100 to 10,000 Angstroms thick (1000 typical) coated with a thin layer of $SiO_xN_y$. The potential advantage of this approach is that a custom focal plane could be generated incorporating this layer without added cost. This in turn allows the full image plane to be coated for example with an unpatterned up-conversion material in order to achieve a two-color sensor.

Figure 10:
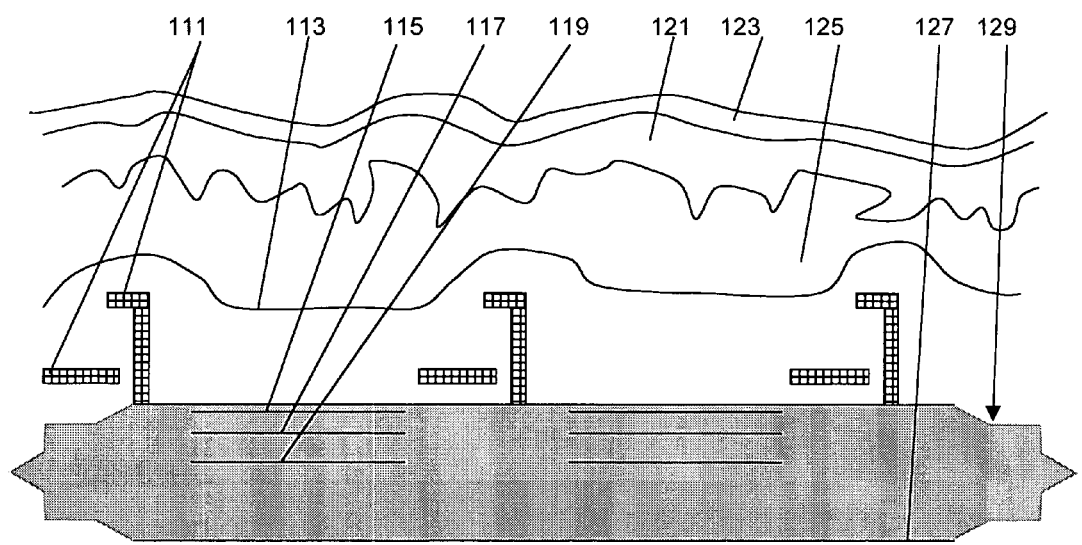
FIG. 10 is a schematic cross sectional view of a back-thinned focal plane sensor with an up-conversion layer on the front surface of the sensor illustrating layered diodes to obtain false color signals.

In FIG. 10, the focal plane sensor incorporates a layered photodiode CMOS sensor as is described for example in U.S. Pat. No. 5,965,875 in order to obtain false color signals. 111 represents interconnect metallization typical of CMOS focal plane arrays. 113 represents the original front surface of the focal plane array. 115 indicates the top or "blue sensitive" pixel of a stacked photodiode pixel. 117 indicates the middle or "green sensitive" pixel of a stacked photodiode pixel. 119 indicates the bottom or "red sensitive" pixel of a stacked photodiode pixel. 121 indicates the transparent cap layer, 123 the reflective layer and 125 the up-conversion material layer. 127 indicates the back thinned surface of the silicon focal plane array. 129 represents the silicon material of the focal plane array.

While there has been shown and discussed what are presently considered the preferred embodiments, it will be obvious to those skilled in this art that various changes and modifications may be made without departing from the scope of this invention and the coverage of the appended claims. Although the description of this application emphasizes silicon for example, it should be understood that other backing materials may be used and the principles of this invention will still be applicable provided that such material does not enable response by the sensor to all wavelengths desired. Likewise although this application has emphasized GaAs as the photocathode, it should be understood that the principles of this invention apply equally to other photocathode materials.

What is claimed is:

1. An imaging device including a back-thinned silicon focal plane array, the improvement comprising positioning an up-converter layer on the front surface of said backside-thinned focal plane array.

2. A CCD with improved wavelength response comprising a back-thinned silicon surface layer, a focal plane array and an up-conversion layer positioned on the front surface of said array.

3. A CMOS imaging device with improved wavelength response comprising a back-thinned silicon surface layer, a focal plane array and an up-conversion layer positioned on the front surface of said focal plane array.

4. An imaging device in accordance with claim 3 in which a said back-thinned silicon surface layer is positioned in a package facing a photocathode across a vacuum and in which said up-conversion layer is selected to detect wavelengths in the range of ~1000 to 2000 nanometers.

5. An imaging device in accordance with claim 4 in which the CMOS includes active pixel sensors.

6. An imaging device in accordance with claim 4 in which the CMOS includes passive pixel sensors.

7. An imaging device in accordance with claim 4 in which the photocathode comprises GaAs.

8. An imaging device in accordance with claim 1 including an up-converter layer on the front surface of the back-thinned silicon focal plane array comprising a phosphor.

9. An imaging device in accordance with claim 8 in which the up-converting layer comprises two distinct phosphor layers, each having different wavelength responses.

10. An imaging device in accordance with claim 1 including a transparent cap overlying the up-converting material and said focal plane array.

11. An imaging device in accordance with claim 10 including a reflective layer adjacent to said transparent cap to reflect image information to said focal plane array.

12. An imaging device in accordance with claim 1 in which the focal plane array comprises a CMOS device.

13. A sensor in accordance with claim 12 in which a photocathode is spaced by a vacuum from said CMOS device with said photocathode facing said silicon surface layer of said CMOS device.

14. A sensor in accordance with claim 8 in which the output of the focal plane array is displayed as false colors.

15. The sensor of claim 1 in which the phosphor enables detection of an aiming beam at ~1.5 microns.

16. The sensor in accordance with claim 1 in which the up converter comprises a material having a sensitivity to light in the range of 1100 to 2000 nm and the capability to re-emit light in the 400–1100 nm range.

17. The method of extending the sensitivity of a back-thinned silicon layer of a focal plane array comprising placing an up-converting layer on the front surface of said focal plane array.

18. The method of claim 17 in which said focal plane array comprises active pixel sensors of a CMOS device.

19. The method of claim 17 in which pixels of said focal plane array are covered with up-conversion material in a predetermined pattern to create a sensor that outputs a signal that can be displayed in a false color image.

20. A sensor in accordance with claim 14 in which pixels of said focal plane array are coated in a predetermined pattern with an up-conversion material.

21. A sensor in accordance with claim 1 comprising at least a first type of up-conversion material positioned coating a fraction of the pixels of said imaging device.

22. A sensor in accordance with claim 21 in which another up-conversion material is positioned coating another fraction of the pixels of said imaging device in a predetermined pattern and in a pattern that differs from the pattern covered by said first type of up-conversion material.

23. A sensor in accordance with claim 1 including filters positioned covering a fraction of the pixels of said focal plane array in a regular pattern.

24. A sensor in accordance with claim 1 comprising a first coating of a fraction of the pixels with a first type of up-conversion material and an uncoated second fraction of the pixels are in a regular pattern.

25. A sensor in accordance with claim 1 in which filters are deposited on a fraction of the pixels in a predetermined pattern.

26. A sensor in accordance with claim 25 in which the filter comprises aluminum.

27. A sensor in accordance with claim 14 in which said phosphor is coated on a stacked photodiode pixilated sensor such that the output of the focal plane array can be displayed as a false-color image.

* * * * *